United States Patent [19]
Naughton et al.

[11] Patent Number: 5,923,166
[45] Date of Patent: *Jul. 13, 1999

[54] ELECTRICALLY INSULATING CANTILEVER MAGNETOMETER WITH MUTUALLY ISOLATED AND INTEGRATED THERMOMETRY, BACKGROUND ELIMINATION AND NULL DETECTION

[75] Inventors: Michael Naughton, Buffalo, N.Y.; Murali Chaparala, Charlottesville, Va.

[73] Assignee: Tau Sensors LLC, Norwood, Mass.

[*] Notice: This patent is subject to a terminal disclaimer.

[21] Appl. No.: 08/980,123

[22] Filed: Nov. 26, 1997

Related U.S. Application Data

[63] Continuation-in-part of application No. 08/640,101, Apr. 30, 1996, Pat. No. 5,739,686.

[51] Int. Cl.[6] ............................. G01R 33/02; G01R 27/28
[52] U.S. Cl. ........................................... 324/244; 324/260
[58] Field of Search .................................. 324/244, 260, 324/259, 226, 658, 661

[56] References Cited

U.S. PATENT DOCUMENTS

5,739,686   4/1998   Naughton et al. ...................... 324/244

*Primary Examiner*—Walter E. Snow
*Attorney, Agent, or Firm*—Notaro & Michalos P.C.

[57] ABSTRACT

A high sensitivity torque and force cantilever magnetometer having a cantilever with isolated capacitance detection and nulling circuits which provides increased sensitivity and accuracy to measurements of a magnetic moment of a sample placed on the cantilever and exposed to a magnetic field. Magnetic detection is by electrical capacitance between a metallized plate and the cantilever. Alternatively, magnetic detection is by electrical resistance of a piezoactive circuit deposited on the surface of the cantilever. The cantilever can be used to measure both isotropic and anisotropic magnetism and is capable of simultaneously measuring the electrical conductivity of the sample using an integrated electrically isolated circuit. The cantilever is constructed of multiple layers of conducting and insulating materials to eliminate leakage current. The magnetometer measures the magnitude of a current through a null detection circuit having at least one nulling loop deposited on the cantilever required to maintain a constant capacitance between the cantilever and a metallized plate to determine the magnetization of the sample. The null detection circuit eliminates capacitance drift and improves the accuracy of the magnetometer.

16 Claims, 7 Drawing Sheets

ELECTRICALLY INSULATING CANTILEVER MAGNETOMETER WITH MUTUALLY ISOLATED AND INTEGRATED THERMOMETRY, BACKGROUND ELIMINATION AND NULL DETECTION

CROSS-REFERENCE TO RELATED APPLICATIONS

This application is a continuation-in-part of U.S. patent application Ser. No. 08/640,101, filed Apr. 30, 1996, now U.S. Pat. No. 5,739,686 which application is hereby incorporated by reference.

BACKGROUND AND FIELD OF THE INVENTION

The present invention relates to a new and useful cantilever magnetometer for measuring magnetic properties of a sample specimen, and in particular to a high sensitivity magnetometer having a cantilever sensing element which can be used in a wide range of magnetic fields and temperatures without any significant degradation in accuracy.

Methods and devices for measuring a magnetic moment of a single crystal sample in a magnetic field using cantilever capacitance have been in existence for about 20 years, while methods for measuring the magnetic properties of single crystals using magnetic torque have been known for about 60 years. For example, a discussion of one type of magnetic torque balance is provided by F. B. Humphrey, et al., in "Sensitive Automatic Torque Balance for Thin Magnetic Film," Rev. Sci. Instr., v.34, p.348 (1963). An early discussion of torque magnetometers can be found in Williams, "Some Uses of the Torque Magnetometer," Rev. Sci. Instr. v.8, p.56 (1936).

There are two cases which can occur when a sample crystal is subjected to a magnetic field. If the sample material has an anisotropic magnetic moment, a uniform magnetic field will cause a magnetic torque, $\tau = m \times B$, (where m is the magnetization or anisotropic susceptibility, and B is the magnetic flux of the field) to be exerted on the sample, thereby causing a torsional displacement of the sample.

If the sample material is isotropic in nature, then a uniform magnetic field will not generate a magnetic torque, and instead, a magnetic field gradient $\nabla B$ is required. The force generated is $F = m \cdot \nabla B$, where m is the magnetization of the sample. The force then causes a displacement of the sample.

These magnetometry techniques are often employed with superconducting materials and used in high magnetic fields and/or low temperatures. Articles discussing such uses include, Brooks, et al., "Small sample magnetometers for simultaneous magnetic and resistive measurements at low temperatures and high magnetic fields," Rev. Sci. Instr. v.58, p.117 (1987), and, Qvarford, et al., "Microtorquemeter for magnetization measurements on small superconducting samples," Rev. Sci. Instr. v.63, p.5726 (1992).

It is also known to use pulsed magnetic fields, which are generated by the rapid release of large amounts of energy through a coil. The resulting magnetic field reaches a peak value within a very short time—usually 0.01 to 0.1 seconds and immediately thereafter returns to zero. Pulsed fields are advantageous for use with cantilever magnetometry techniques because the very short periods in which the magnetic fields are generated do not induce as much thermal heating in the coil windings. Since a current is only applied in short, rapid bursts in a pulsed coil, much larger currents may be used without melting the coil. Thus, greater magnitude magnetic fields can be generated using pulsed magnetic fields without damage to conventional equipement. Currently, pulsed fields in the range of 70 Tesla can be generated, and it is expected that 100 Tesla fields will be possible in the near future. These field strengths are about 3 times greater than fields generated using conventional DC magnetic field generation techniques.

Cantilever magnetometry technology is used to measure the magnetic properties of the sample using the relationship between the magnetic force (or torque) and the displacement of a cantilever beam caused by the force or torque exerted on the sample.

The sample is placed on a cantilever and subjected to a magnetic field. Reaction between the magnetism of the sample and the magnetic field causes a displacement of the sample which can be measured in one of several ways. The displacement is proportional to the magnetic properties of the sample.

One known device which uses capacitance for measuring the displacement is disclosed in the Brooks article, supra. It measures the capacitance change between two electrodes caused by displacement of the sample.

A commercially available device which is commonly used to measure magnetic moments in low strength magnetic fields is the superconducting quantum interference device (SQUID). This device's sensitivity is approximately $10^{-9}$ Joules/Tesla in a range of magnetic field strengths from 0.01 Tesla to about 7 Tesla. At increasingly higher magnetic field strengths, this device's sensitivity can decrease considerably due to interference from high magnetic fields. The Qvarford article, supra, discusses other limitations of the superconducting quantum interference device.

Another, more advanced device for measuring magnetic properties of superconducting materials is disclosed in an article by Chaparala, et al., entitled "Capacitance Platform Magnetometer for Thin Film and Small Crystal Superconductor Studies" AIP Conf. Proc., p.407 (1993).

The device disclosed by Chaparala, et al., is a silicon wafer cantilever with gold lead wires on a top side, and a metallized bottom side, electrically connected to a capacitance bridge. The bottom side of the wafer acts as the upper plate of a capacitor. The bottom plate of the capacitor is a metallized plate separate from the wafer. The gold lead wires form a symmetrical pair of nulling loops on the top side. Several single electrical conductivity leads extend along the cantilever top side between the loops. A sample is placed in between the nulling loops in electrical contact with the single leads.

Both magnetic torque and magnetic force may be measured with the device. However, the sensitivity of this device, while better than other known devices, such as the superconducting quantum interference device (SQUID), is still limited by noise and leakage currents between the capacitance and the nulling loop circuits and to the specimen. Additionally, temperature differences can also affect the sensitivity of the Chaparala, et al. device.

SUMMARY OF THE INVENTION

It is a primary object of this invention to provide a highly sensitive torque and force cantilever magnetometer for measuring the magnetic properties of a sample material.

Accordingly, an electrically insulated cantilever sensing element is provided which can be used to measure magnetic properties of a sample by electrical capacitance, or by electrical resistance of a piezoactive circuit integrated with the insulator material. The cantilever magnetometer has a null detection circuit and a simultaneous electrical resistivity measurement circuit, both of which are electrically isolated from the magnetic signal sensing circuit and from each other. An electrically isolated thermometry circuit integrated with the cantilever and placed in close proximity to the sample is used to make accurate measurements of the sample temperature. Temperature and magnetic field dependent background signals from the cantilever itself are eliminated by a bridge subtraction circuit.

The cantilever element is an integrated piece which has a base portion with a measurement platform connected to it by an elongated neck. Both the platform and base are wider in plan than the neck portion.

The sample being measured is rigidly adhered to the cantilever measurement platform surface and subjected to a magnetic field. The resulting currents produced in each of the circuits on the cantilever are indicative of the magnetic qualities of the sample.

The cantilever element of the invention is composed of several layers of materials adhered to each other. A base of an electrically insulating material, or dielectric, such as silicon coated on its top side with a layer of silicon nitride ($Si_3N_4$), has an adhesion layer of a metal, such as chromium or titanium, applied to each of its bottom and top sides. A conductive layer of gold or other electrically conducting metal is adjacent each adhesion layer.

The bottom conductive layer is an etched or deposited pattern of several adjacent pairs of L-shaped leads which inhibit the formation of eddy currents, while acting as the top plate of a capacitor. The elimination of eddy currents enhances the sensitivity of the cantilever.

The top conductive layer has several individual etched or deposited circuits. The top layer contains two balanced nulling loops forming one circuit, a strain gauge loop circuit using a piezoactive element for the loop, one or more pairs of electrical transport leads, and a capacitance bridge lead for electrically connecting the bottom conductive layer of the cantilever to one side of a capacitance bridge. A thermometry thermal link platform is placed in contact with the circuits.

The bottom conductive layer of the cantilever element acts as the top plate of a capacitor. A block, or other support, located below the bottom conductive layer of the cantilever has a metallized plate surface spaced apart from and opposed to the bottom conductive layer. The metallized plate surface is the bottom plate of the capacitor and is electrically connected to a different side of the capacitance bridge.

In an embodiment of the cantilever useful for eliminating background noise, a second cantilever of similar composition is placed in proximity to the first cantilever, or the second cantilever can be formed from the same layers as the first cantilever. The second cantilever is subjected to the same magnetic fields, however, no sample is placed on the second cantilever; the capacitance changes in the second cantilever are removed from the measurement by capacitance bridge subtraction.

The cantilever of the invention has improved sensitivity and is capable of measuring the magnetic moments of samples in higher strength fields with greater accuracy than other known devices. The cantilever can function properly in either DC or pulsed magnetic fields.

The nulling loops allow the cantilever to be calibrated while it is in place; the calibration is limited only by the ability to measure the current through the loops. Further, by measuring the current through the loops required to maintain the same capacitance value between the metallized plate and bottom conductive layer of the cantilever, the magnetic force or torque can be determined directly, and more accurately than known devices.

Alternatively, the peizoactive loop circuit can be used to determine the force or torque exerted on the cantilever. The piezoactive strain loop is placed across the portion of the cantilever neck most susceptible to stress from a vertical deflection. The change in measurement of the strain is directly proportional to the deflection of the cantilever.

It is also envisioned that a device of the invention can be used to measure magnetic fields by mounting a known sample on the cantilever and then exposing the device to a magnetic field.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
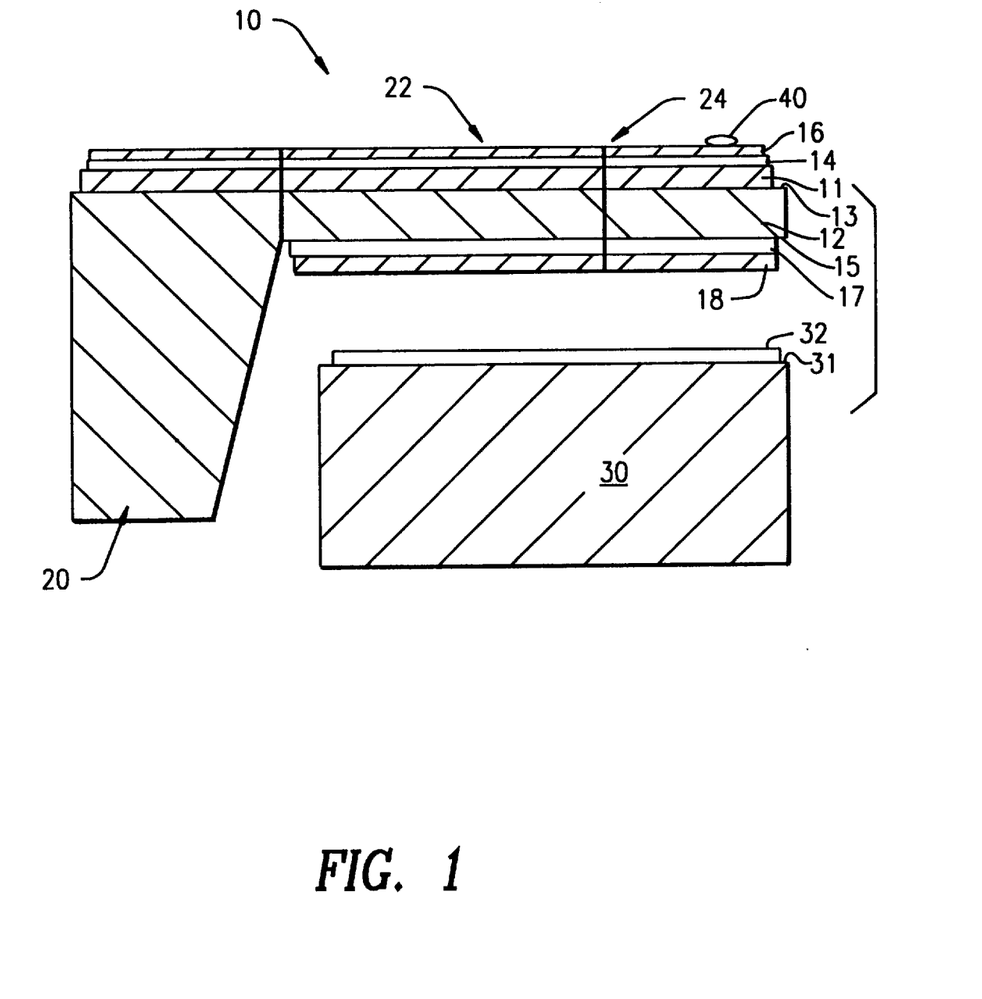
FIG. 1 is a side elevation view of a cantilever element of the invention.

Turning now to the drawings, FIG. 1 shows a cantilever, generally designated 10, placed in proximity to a block 30.

Cantilever 10 is an integrated piece of layered materials. A dielectric substrate 12 forms the basic shape of the cantilever 10. A base 20 is connected to measurement platform 24 by an elongate neck 22. The base 20 and platform 24 are both rectangular in plan, while base 20 of substrate 12 is thicker than either platform 24 or neck 22. Suitable thicknesses for the base 20, and neck 22 and platform 24, are 250 $\mu$m and 5 $\mu$m, respectively. Neck 22 is narrower than both base 20 and platform 24 and is capable of only vertical motion.

The remaining layers are directly or indirectly adhered to either the top surface 13 or bottom surface 15 of the substrate 12.

Top surface 13 of substrate 12 may have a coating of insulating material 11 applied. An adhesion layer 14 of a non-magnetic metal contacts insulating material 11. Finally, a top conducting layer 16 is deposited onto adhesion layer 14.

Bottom surface 15 of substrate 12 is covered by a second adhesion layer 17 of a similar material as adhesion layer 14.

A bottom conducting layer 18 is deposited onto adhesion layer 17. While not shown in FIG. 1, a portion of bottom conducting layer 18 may extend onto base 20 of substrate 12, as shown as lead 51 in FIG. 4. An acceptable thickness for bottom conducting layer 18 is 50 nm.

The substrate 12 is preferably made of silicon, with insulator 11 being silicon nitride ($Si_3N_4$). Alternatively, substrate 12 and insulator layer 11 may be a single substrate 12 of silicon, or another dielectric, such as the commercially available polymer KAPTON (made by DuPont), or other non-conducting polyimide. The substrate is made 4500 nm thick in a preferred embodiment. When insulator layer 11 is used, it can be about 10 nm thick.

Adhesion layers 14, 17 are preferably made of titanium, although other non-magnetic insulators are suitable, such as chromium. The conducting layers 16, 18 are gold or other good conducting metal which is easily etched or deposited onto adhesion layers 14, 17. A preferred thickness for each of the adhesion layers is 3 nm.

Block 30 has top surface 31 which supports metallized plate 32. Block 30 is placed a distance away from cantilever 10 so as to produce a capacitance gap between metallized plate 32 and bottom conducting layer 18. The gap is preferably between 10 and 100 μm, although larger and smaller gaps may be used. The block 30 can be made of any non-magnetic insulator, such as glass. Metallized plate 32 is a good conductor, such as gold or copper. A contact connection 52 is provided on plate 32 for connecting the plate to one side of a capacitance bridge circuit 50.

A sample 40 is placed on the cantilever platform 24 on top conducting layer 16 to have its magnetic properties analyzed. Sample 40 may be a single crystal, a polycrystal, or an amorphous specimen.

Figure 2:
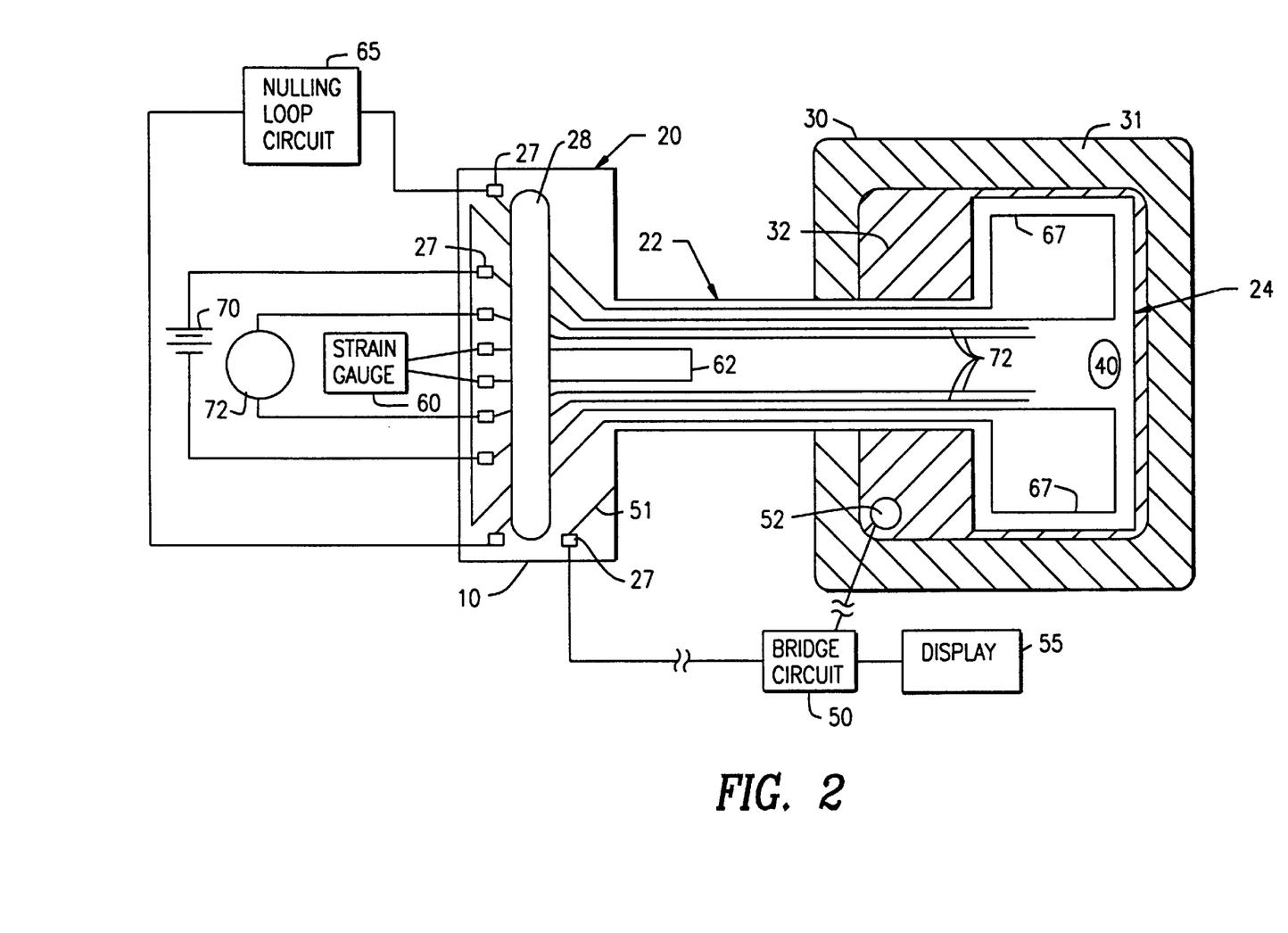
FIG. 2 is an electromechanical schematic top plan view of a single cantilever element.

The various electrical circuits etched or deposited as top conducting layer 18 and which can be used with cantilever 10 are shown in FIG. 2. An acceptable thickness for the top conducting layer is 100 nm.

Symmetrical nulling loops 67 are provided on each side of platform 24. The nulling loops 67 are single loops which conform roughly to the outline of the platform 24. The loops are open on the side nearest the neck 22, and the leads forming the loops 67 extend parallel along the neck 22 to the base 20 of cantilever 10. Two of the leads of the single loops are connected in the base 20 and the other two leads end in contacts 27, which can be electrically connected to a nulling loop circuit 65. Nulling loop circuit 65 is used to provide and measure a variable-sized current to loops 67, which will generate a directly proportionately sized magnetic field. Nulling loop circuit 65 may consist of an ammeter in series with a current source.

Strain gauge 60 is connected to the contacts 27 of strain loop 62. Strain loop 62 extends onto neck 22 from base 20 near the center of the base 20. Strain loop 62 is also a single loop of parallel leads of a piezoactive material.

Electrical transport measurement leads 72 extend from base 20 parallel along neck 22 toward measurement platform 24 adjacent sample 40. While four transport leads 72 are shown in the drawings, it should be noted that more or fewer leads can be used and still be within the scope of the invention. The leads have contacts 27 at their ends in base 20. The contacts 27 can be used to connect two of the leads 72 to a voltage source 70, and two remaining leads 72 to a voltmeter 74 for measuring the electrical conductivity of the sample 40.

Figure 4:
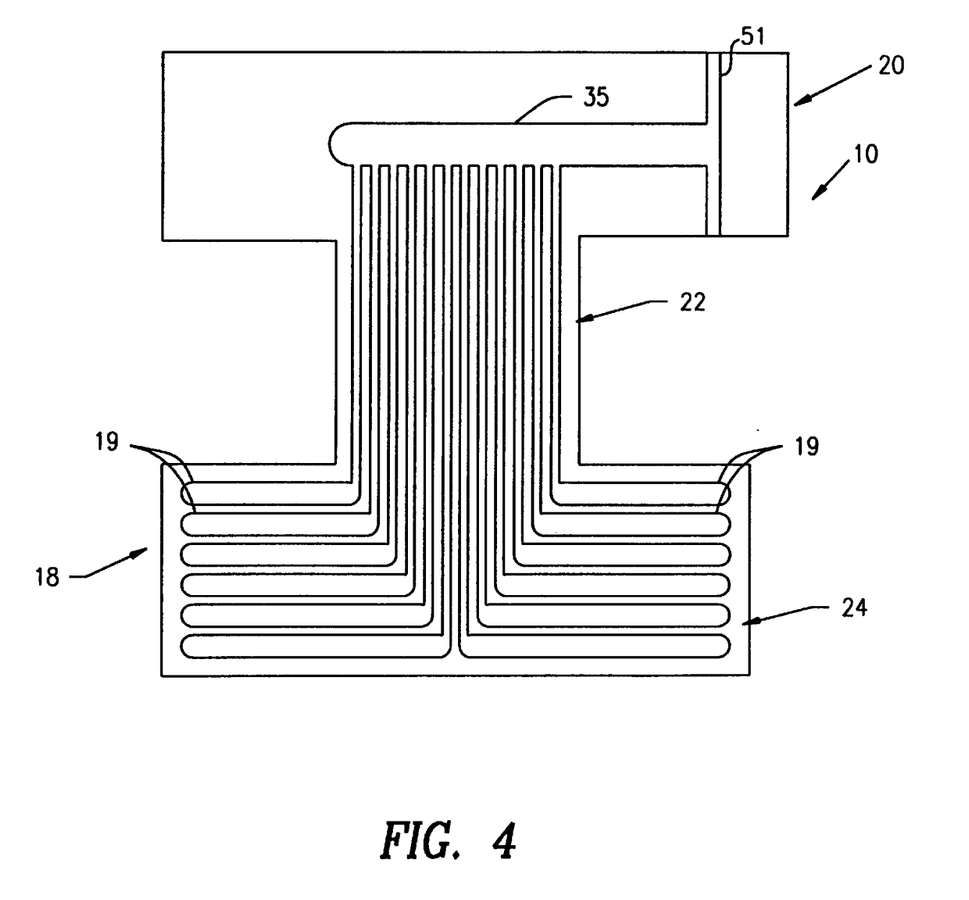
FIG. 4 is a bottom plan view of the cantilever element of FIG. 1.

Capacitor plate lead 51 connects the L-shaped capacitor electrode leads 19 and capacitor electrode bus 35 of the bottom conductive layer 18, as shown in FIG. 4, to a contact 27 on the top conductive layer 16. Lead 51 is connected via contact 27 to the other side of capacitor bridge circuit 50. The purpose of the particular pattern of electrode leads 19 is to minimize eddy current effects.

Capacitor bridge circuit 50 may be any known capacitance bridge circuit, such as a Wheatstone bridge, which has a sensitivity of at least $10^{-4}$ pF. The display 55 indicates when the bridge is balanced and can be a simple analog meter or a digital display. Commercially available bridges include General Radio GR 1615 and Andeen Hagerling 2500A bridges.

Thermometry thermal link platform 28 covers all of the leads in base 20, except for capacitor plate lead 51, and provides a link to a thermometer for indicating the temperature of the cantilever 10 and sample 40. Thermal link platform 28 does not make electrical contact with the leads, keeping the thermometry instrumentation electrically isolated from the other circuits on cantilever 10. The platform 28 is a highly thermally conductive material.

Figure 3:
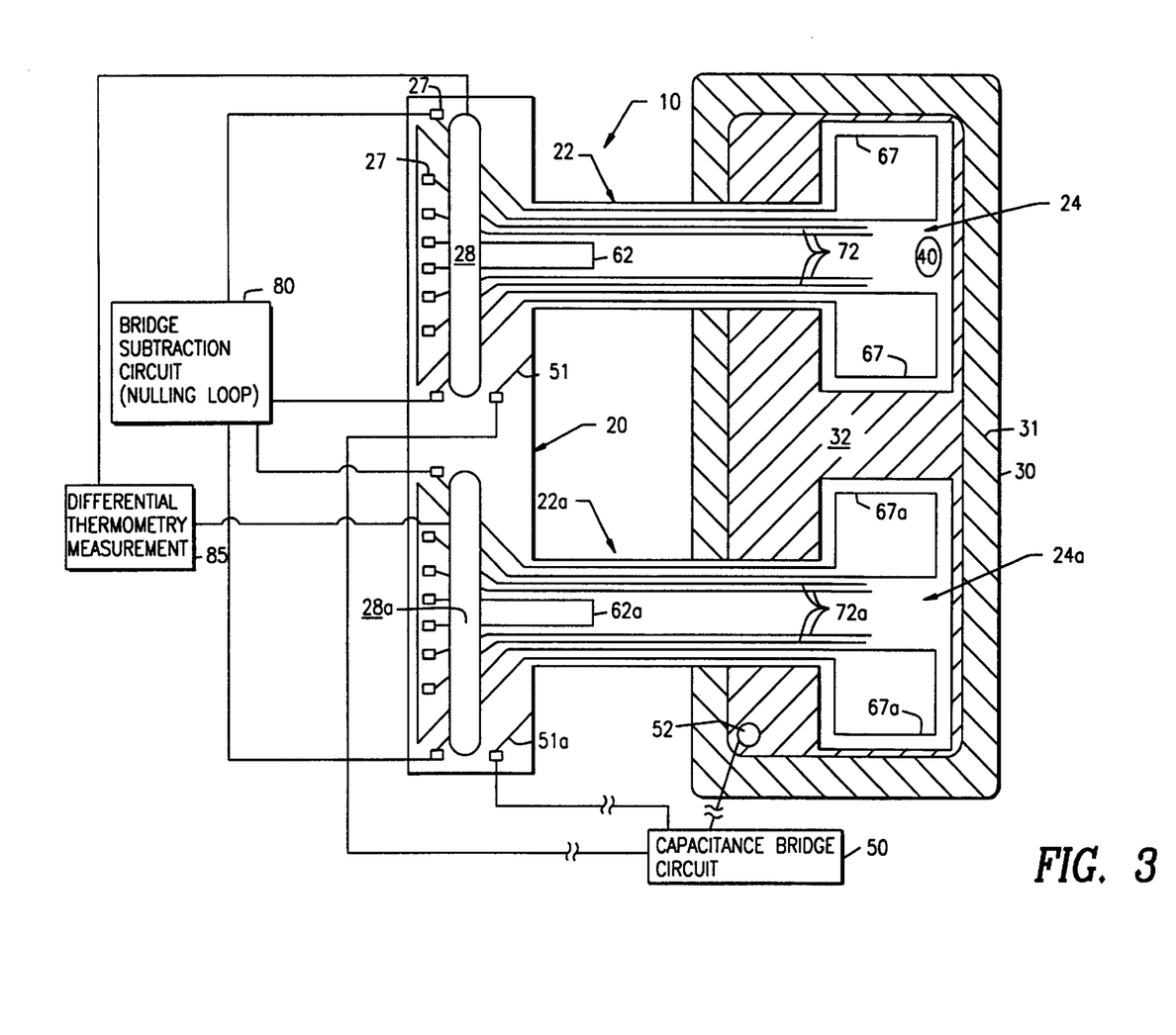
FIG. 3 is an electromechanical schematic top plan view of an alternate embodiment of the cantilever of the invention.

In FIG. 3, an embodiment of the cantilever 10 in which two identical cantilevers 10 are formed as one unit has a common base 20, with necks 22, 22a extending outward over block 30 and metallized plate 32 and ending in measurement platforms 24, 24a. One measurement platform 24 has a sample 40 placed on it between nulling loops 67.

Each cantilever 10 has the bottom conductive layer 18 connected via capacitor plate leads 51, 51a to capacitance bridge circuit 50. Metallized plate 32 is connected to capacitance bridge circuit 50 as well.

The nulling loops 67, 67a are connected across a nulling loop bridge subtraction circuit 80. The bridge substraction circuit 80 may be any known bridge circuit which can subtract the signal from the reference cantilever nulling loop 67a from the sample cantilever nulling loop 67. Thermometry links 28, 28a may also be connected to a differential measurement device 85. While not shown in FIG. 3, the electrical transport leads 72, 72a and strain loops 62, 62a may be connected to corresponding circuits as shown in FIG. 2.

In the capacitance mode, the cantilever 10 is utilized in the following manner. The sample 40, usually a single crystal, although other types of samples may be measured, is rigidly adhered to the top surface of the cantilever measurement platform 40 between the nulling loops 67 using a suitable adhesive. The sample 40 and cantilever 10 are oriented relative to block 30, such that bottom conducting surface 18 and metallized plate 32 form the top and bottom plates, respectively, of a capacitor. When the cantilever is connected as described above, it is subjected to a magnetic field.

Depending on the magnetic nature (i.e. anisotropic or isotropic) of the sample, a constant or gradient magnetic field is used.

If the sample 40 possesses anisotropic magnetism, and the magnetic moment arising from the interaction of the sample 40 magnetism with the externally applied magnetic field does not align parallel or antiparallel with the applied magnetic field, the sample 40 will experience a magnetic torque, τ, defined as τ=m×B, where m is the magnetization and B is the magnetic field strength. The torque will cause the sample 40 to rotate. Since the sample is rigidly attached to the measurement platform of the cantilever 10, the platform 24 will also tend to rotate, or deflect.

The deflection causes the capacitance of the capacitor formed by the bottom conductive layer 18 (capacitor electrode leads 19) of the cantilever 10, which forms the top plate of the capacitor, and the metallized plate 32, which forms the bottom plate, to change as the gap between the two plates increases or decreases. This change can be measured using bridge circuit 50.

The change in capacitance can usually be measured accurately, with resolution to about 1 to 10 aF. A typical equilibrium capacitance, that is, the capacitance before the magnetic field is enabled, is about 0.1 to 1 pF.

The change in capacitance, $\Delta C$, will be directly related to the magnetism of the sample 40. This assumes that a harmonic restoring force according to Hooke's law governs the mechanical response of the cantilever 10. The harmonic approximation can be used if the deflection of the cantilever measurement platform 24, $\Delta d$, is small; for a small $\Delta d$, the torque $\tau$ is proportional to $\Delta d$. The $\Delta C$ is proportional to $\Delta d/(d(d+\Delta d))$, and the torque, $\tau$, is therefore linearly proportional to the capacitance change $\Delta C$ to first order. Depending on the size of sample 40, the deviation from linearity can be between 0–10%. However, when a null deflection feedback circuit, such as the nulling loops 67, is used, the linearity varies less than 0.01%. This results in the $\Delta C$ being directly proportional to the magnetism, m.

Measuring the capacitance change will always lead to inaccurate results, however, due to drift and variances in the distance d between the capacitor plates. In order to obtain accurate measurements of anisotropic materials, a different measurement method is required.

The nulling loops 67 of the cantilever 10 of the present invention allow the magnetism of the sample to be measured directly by measuring the current, $I_n$, through the nulling loops required to maintain a constant gap, and therefore a constant capacitance, between the metallized plate 32 and bottom conducting layer 18. The current, $I_n$, applied to single turn nulling loops 67 bounding an area, A, creates a magnetic moment, $m_n$, as defined by the equation $m_n=I_n \times A$, which is directed anti-parallel to the magnetic field B which is creating the torque $\tau$. If the two magnetic moments, m and $m_n$ are equal, the gap and capacitance will remain constant. Therefore, by measuring the current $I_n$ through the nulling loops 67 required to maintain the cantilever 10 in the balanced state, the magnetism of the sample 40 can be accurately determined.

The sensitivity of the device in this mode is dependent on the strength of the magnetic field, and improves with higher magnetic field strengths. Given a 1 Tesla uniform field, and a torque sensitivity, $\delta\tau$ of 1 pNm, the magnetic sensitivity, $\delta m$ is:

$$\delta m = \delta\tau/(B\sin\theta)$$

in the case where transverse moments are detected, $\Theta=\pi/2$, and $$\delta m = 1 \text{ pNm}/1 \, T$$
$$\delta m = 10^{-12} J/T,$$

whereby the sensitivity, $\delta m$, increases proportionately to the strength of the magnetic field in which the cantilever 10 is used.

In the alternate case, where the magnetism of the sample 40 is isotropic, a uniform field will not generate a deflection in the sample 40 and cantilever measurement platform 24. A gradient magnetic field, $\nabla B$ must be used instead to generate a force, F, according to the equation $F=M\cdot\nabla B$, where M is the magnetic moment per unit volume $(J/Tm^3)$. The force F will cause a proportional deflection $\Delta d$ of the sample 40, and thereby the platform 24 and capacitor electrode leads 19, toward or away from the metallized plate 32, causing a change in the capacitance $\Delta C$. As explained above in the anisotropic case, this capacitance change $\Delta C$ is directly proportional to the deflection $\Delta d$, and therefore $\Delta C$ F M m, or a change in capacitance directly proportional to the magnetism of the sample 40.

Accordingly, the nulling loops 67 may be used to generate a magnetic moment, $m_n=I_n \times A$, equal and opposite to the magnetic moment generated by the gradient magnetic field $\nabla B$. By measuring the current $I_n$ required to keep the capacitance C constant, the magnetic force is directly measured.

The sensitivity of the cantilever in the force mode is determined as follows. Given a gradient magnetic field $\nabla B=10$ T/m, which is relatively simple to provide, and a force sensitivity $\delta F=1$ $\mu$g-force=$10^{-8}$ N, the moment sensitivity $\delta m$ is:

$$\delta m = \delta F/\nabla B = 10^{-8} \, N/10 T/m = 10^{-9} \, J/T$$

assuming a fixed magnitude gradient, such that the sensitivity is independent of the field, and is valid for a zero field. Experimentation has shown that the cantilever 10 made according to the invention can have force sensitivities of between 0.1 and 5 $\mu$g-force depending on the materials used.

An alternate circuit for measuring the deflection $\Delta d$ uses the piezoactive strain loop 62 and strain gauge 60. This embodiment places the strain loop at the point on the neck 22 most susceptible to stress when the cantilever 10 deflects. The strain gauge 60 is used to determine when the cantilever deflects and the nulling loops 67 are used in the same manner as above to maintain the strain gauge 60 at a constant level. The current $I_n$ indicates the magnetism of the sample 40.

The cantilever 10 of the invention, when used in either mode, eliminates capacitance drift over time, since the cantilever 10 is continually being calibrated as the measurements of the nulling current are made. Further, the insulating properties of the adhesion layers 14, 17 eliminate interaction and leakage currents forming between the nulling loops 67 and the capacitor electrode leads 19. Simultaneous measurement of the conductivity of the sample 40 using electrical transport leads 72 and voltage source 70 and voltmeter 74 is also possible.

Background noise and temperature and magnetic field variations can also be eliminated by using the cantilever 10 of FIG. 3, where one cantilever arm 22, 24 is used to measure the force exerted on the sample, while the second cantilever arm 22a, 24a acts as a reference. The reference cantilever 22a, 24a signals are subtracted from the sample cantilever 22, 24 signals using standard bridge subtraction techniques. In effect, the cantilever arms act as two arms of a Wheatstone bridge. This further increases the accuracy and sensitivity of the magnetometer.

Figure 5:
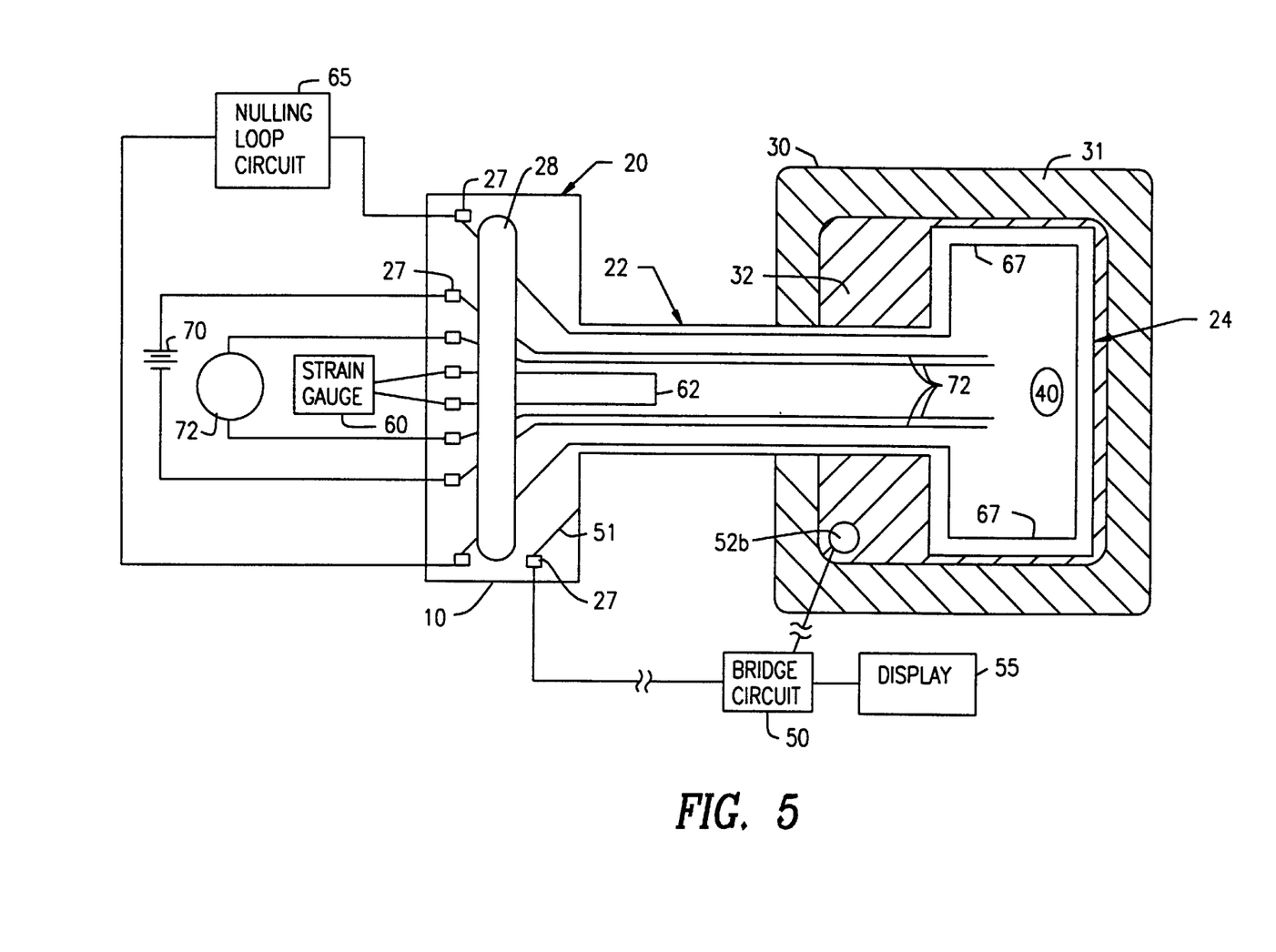
FIG. 5 is an electromechanical schematic top plan view of a cantilever having an alternate cantilever nulling loop configuration.

In FIG. 5, the cantilever has nulling loop 67 deposited around the edges of the cantilever platform 24 in a single loop, rather than having halves of the loop 67 connected in the base 20. The nulling loop 67 is connected in the same manner as discussed above, and functions in the same manner.

Figure 6:
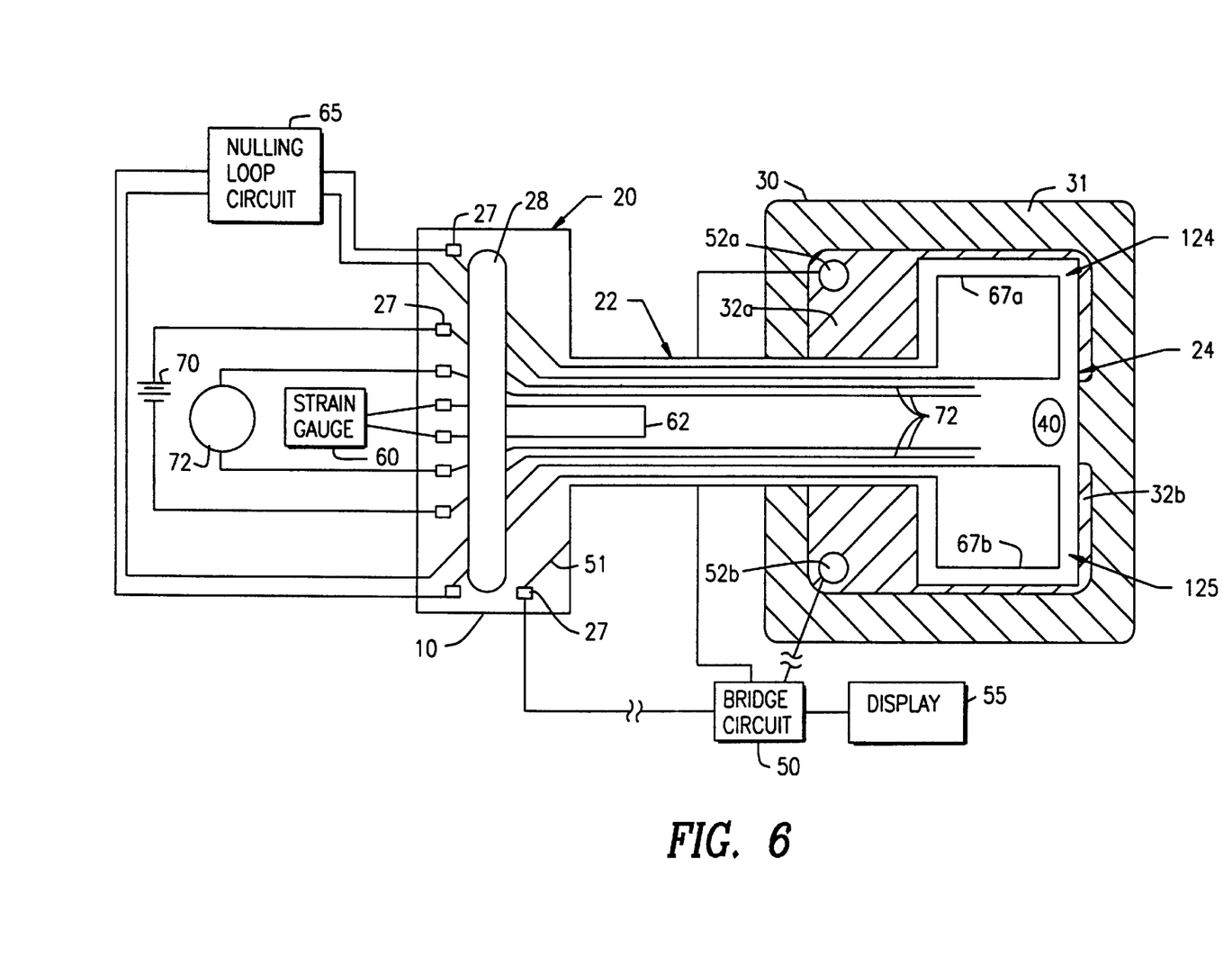
FIG. 6 is an electromechanical schematic top plan view of a third embodiment of the cantilever.
Figure 7:
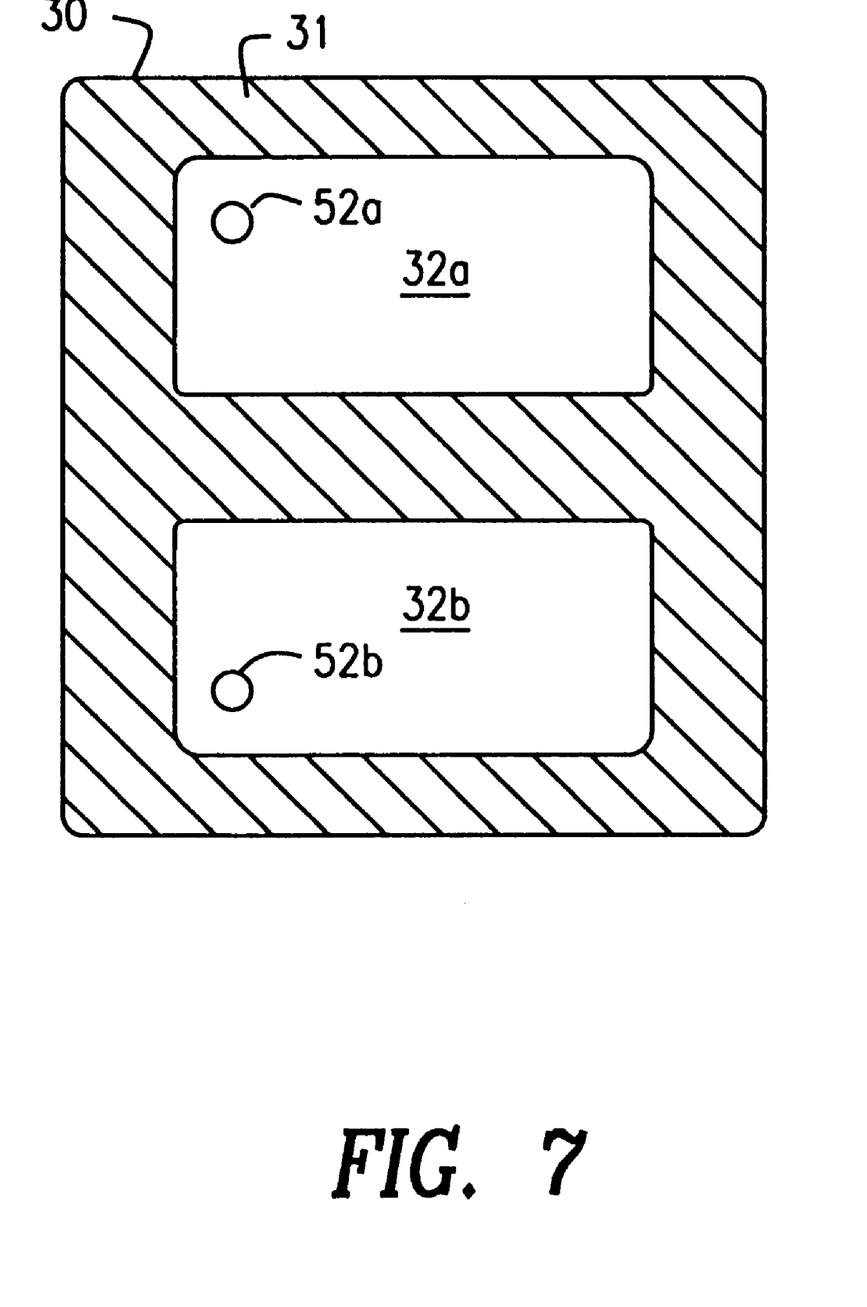
FIG. 7 is top plan view of the bottom capacitance plate of FIG. 6.

FIGS. 6 and 7 show an alternate embodiment of the cantilever having two separate nulling loops 67a, 67b with both ends of each loop 67a, 67b connected to the nulling loop circuit 65. The nulling loop circuit 65 is modified to permit indpendent control of each loop 67a, 67b.

In this embodiment, the metallized plate 32 is provided as two electrically isolated plates 32a, 32b (best shown in FIG.

7). One plate 32a, 32b is provided beneath each side, or wing 124, 125 of the measurement platform 24. The bottom of cantilever 10 is the same as in FIG. 4, with electrode leads 19 connected to bus 35 and lead 51. Connector lead 51 and metallized plate connectors 52a, 52b are all electrically connected to bridge circuit 50 to sense a differential capacitance between each set of metallized plates 32a, 32b and electrode leades 19.

The independence of the nulling loop 67a, 67b controls and the differential capacitance sensed from the metallized plates 32a, 32b and electrode leads 19 generated beneath each wing 124, 125, permits even greater accuracy in the detection and elimination by compensation of deflections of the cantilever wings 124, 125 toward one plate 32a, 32b and away from the other plate 32b, 32a. One such instance is where the sample 40 generates a magnetic torque about an axis through the center of the cantilever platform 24 and neck 22.

Alternatively, the strain gauge 62 could also be used to detect this twisting or flexion motion in the cantilever platform 24 in the section of the strain gauge 62 perpendicular to the axis of rotation or flexion.

Another use for any one of the embodiments of the invention which is envisioned is to provide a sample 40 with known properties on the cantilever platform 24 and then expose the cantilever to magnetic fields to detect their presence and magnitude variation in space. When used in this manner, a cantilever 10 of the invention could help detect geomagnetism as well as in vivo physiomagnetism, such as neuromagnetism or cardiomagnetism. Either the piezoelectric strain gauge or capacitance detection can be used to detect the magnetic field.

While a specific embodiment of the invention has been shown and described in detail to illustrate the application of the principles of the invention, it will be understood that the invention may be embodied otherwise without departing from such principles.

What is claimed is:

1. A cantilever for a cantilever magnetometer, the cantilever comprising:
   a dielectric substrate having a planar top surface and a planar bottom surface, a measurement platform, an elongated neck, and a base, the elongated neck connecting the base and the measurement platform;
   a coating of an electrical insulating material on the planar top surface;
   a first conducting layer one of deposited and etched on to the planar bottom surface, for forming a capacitor plate; and
   a second conducting layer which is one of deposited and etched on to the coating, the second conducting layer having at least one nulling loop on the measurement platform such that a sample may be placed within the at least one nulling loop on the measurement platform.

2. A cantilever according to claim 1, wherein the dielectric substrate comprises one of an insulating polymer and a semiconductor coated with an insulating layer on the planar top surface.

3. A cantilever according to claim 1, further comprising an electrically isolated thermometer in thermal contact with the conducting layer at the base.

4. A cantilever according to claim 1, wherein the conducting layer further comprises at least one pair of elongated electrical transport leads for measuring electrical conductivity of the sample on the measurement platform, each transport lead having two ends, one end of each transport lead being located on the base.

5. A cantilever according to claim 1, wherein the second conducting layer further comprises an open loop of piezoactive material, having two ends and the loop located on the elongated neck at least partly at a point which incurs the greatest stress when the elongated neck is deflected, the open side of the loop being adjacent the base, and the ends of the loop each connected to a contact.

6. A cantilever according to claim 1, wherein the at least one nulling loop is a pair of nulling loops, the pair of nulling loops being electrically isolated from each other on the cantilever, the sample being positioned between the nulling loops.

7. A cantilever according to claim 6, wherein the nulling loops are symmetrical with respect to a center axis of the dielectric substrate.

8. A cantilever magnetometer comprising:
   a dielectric substrate having a planar top surface and a planar bottom surface, a measurement platform, a elongated neck, and a base, the elongated neck connecting the base and the measurement platform;
   a coating of an electrically insulating material on the planar top surface;
   a first conducting layer one of deposited and etched on to the planar bottom surface for forming an upper capacitor plate;
   means for electrically connecting the upper capacitor plate to a capacitance bridge circuit;
   a second conducting layer which is one of deposited and etched on to the coating, the second conducting layer having at least one nulling loop on the measurement platform such that a sample may be placed within the at least one nulling loop on the measurement platform;
   means for providing a current to the at least one nulling loop;
   means for measuring the current provided to the at least one nulling loop;
   a block having a plate surface; and
   at least one metallized plate supported on the block plate surface forming at least one lower capacitor plate, the block and at least one metallized plate oriented in close proximity and opposed to the first conductive layer forming the upper capacitor plate, creating a capacitance gap between each at least one lower capacitor plate and the upper capacitor plate, the at least one metallized plate being electrically connected to the capacitance bridge circuit.

9. A cantilever magnetometer according to claim 8, wherein the dielectric substrate comprises one of an insulating polymer and a semiconductor coated with an insulating layer on the planar top surface.

10. A cantilever magnetometer according to claim 8, further comprising an electrically isolated thermometer in thermal contact with the conducting layer at the base.

11. A cantilever magnetometer according to claim 8, wherein the conducting layer further comprises at least one pair of elongated electrical transport leads for measuring electrical conductivity of the sample on the measurement platform, each transport lead having two ends, one end of each transport lead being located on the base.

12. A cantilever magnetometer according to claim 8, wherein the at least one nulling loop is a pair of nulling loops, the pair of nulling loops being electrically isolated from each other on the cantilever, the sample being positioned between the nulling loops.

13. A cantilever magnetometer according to claim 12, wherein the nulling loops are symmetrical with respect to a center axis of the dielectric substrate.

14. A cantilever magnetometer according to claim 12, wherein the at least one metallized plate comprises a pair of metallized plates electrically isolated from each other, each one of the metallized plates aligned with a portion of the upper plate and forming a pair of capacitance gaps therebetween, each metallized plate connected to the capacitance bridge, wherein the capacitance bridge is a differential capacitance bridge.

15. A cantilever magnetometer according to claim 8, wherein the second conducting layer further comprises a strain loop of piezoactive material, having two ends and the strain loop located on the elongated neck at least partly at a point which incurs the greatest stress when the elongated neck is deflected, the ends of the strain loop being adjacent the base and connected to strain gauge means for measuring a resistance in the strain loop.

16. A cantilever for a cantilever magnetometer, the cantilever comprising:

a dielectric substrate having a planar top surface and a planar bottom surface, a measurement platform, an elongated neck, and a base, the elongated neck connecting the base and the measurement platform;

a conducting layer one of deposited and etched on to the planar top surface, the conducting layer having an open loop of piezoactive material, having two ends and the loop located on the elongated neck at least partly at a point which incurs the greatest stress when the elongated neck is deflected, the open side of the loop being adjacent the base, and the ends of the loop each connected to a contact; and at least one symmetrical nulling loop on the measurement platform such that a sample may be placed within the at least on nulling loop on the measurement platform.

* * * * *